US010892175B2

(12) United States Patent
Martinez et al.

(10) Patent No.: US 10,892,175 B2
(45) Date of Patent: Jan. 12, 2021

(54) STABLE HEATER REBUILD INSPECTION AND MAINTENANCE PLATFORM

(71) Applicant: Samsung Electronics Co., Ltd., Suwon-si (KR)

(72) Inventors: Rodolfo Martinez, Round Rock, TX (US); Robert Bell, Austin, TX (US); Robert Stebbins, Round Rock, TX (US)

(73) Assignee: SAMSUNG ELECTRONICS CO., LTD.

( * ) Notice: Subject to any disclaimer, the term of this patent is extended or adjusted under 35 U.S.C. 154(b) by 273 days.

(21) Appl. No.: 16/046,983

(22) Filed: Jul. 26, 2018

(65) Prior Publication Data

US 2020/0035520 A1 Jan. 30, 2020

(51) Int. Cl.
*H01L 21/67* (2006.01)
*H01L 21/687* (2006.01)
*F16M 11/16* (2006.01)
*H05B 6/10* (2006.01)
*F16M 11/42* (2006.01)

(52) U.S. Cl.
CPC ....... *H01L 21/67103* (2013.01); *F16M 11/16* (2013.01); *F16M 11/42* (2013.01); *H01L 21/68742* (2013.01); *H01L 21/68785* (2013.01); *H05B 6/105* (2013.01)

(58) Field of Classification Search
CPC . E04H 12/22; E04H 12/2269; E04H 12/2292; F16M 11/16; H01L 21/67103; H01L 21/68785; H01L 21/68792
See application file for complete search history.

(56) References Cited

U.S. PATENT DOCUMENTS

| | | | | |
|---|---|---|---|---|
| 1,830,769 A | * | 11/1931 | James | A47G 7/025 248/154 |
| 4,064,993 A | * | 12/1977 | Getner | A47G 7/041 211/85 |
| 4,801,123 A | * | 1/1989 | Lynch | A47G 33/12 248/150 |
| 5,772,773 A | | 6/1998 | Wytman | |
| 7,997,215 B2 | | 8/2011 | De Keyzer | |
| 2001/0047742 A1 | | 12/2001 | Moore | |
| 2004/0144901 A1 | * | 7/2004 | Nauseda | B01D 46/2411 248/146 |
| 2014/0353456 A1 | * | 12/2014 | Wong | A47G 33/1206 248/523 |
| 2017/0072516 A1 | | 3/2017 | Elliot et al. | |

* cited by examiner

*Primary Examiner* — Tyrone V Hall, Jr.
(74) *Attorney, Agent, or Firm* — Renaissance IP Law Group LLP

(57) ABSTRACT

A stand for a heater pedestal with a base member and a support member detachably coupled to the base member, the support member having a plurality of ring members and at least one spacer member extending vertically from the base member, a ring member separated from another ring member by a spacer member, a ring member having an aperture which extends through the ring member in a horizontal direction, the at least one spacer member forming at least one opening between two corresponding ring members, and the ring member furthest from the base member configured to support a heater pedestal, and the apertures of the ring members of the support member being configured to receive a susceptor of the heater pedestal.

20 Claims, 10 Drawing Sheets

STABLE HEATER REBUILD INSPECTION AND MAINTENANCE PLATFORM

TECHNICAL FIELD

The present disclosure relates to stands used in relation to semiconductor heater pedestals.

BACKGROUND

Semiconductor manufacturing processing uses a wide variety of surfaces whose contact with a wafer is highly regulated. Contamination of these surfaces produces a number of issues, including particle formation and malformation of layers. Furthermore, backside contamination may spread contamination between multiple processes, causing a cascade of failures across a semiconductor manufacturing plant. Contamination thus must be minimized whenever possible, especially backside contamination.

SUMMARY

Example embodiments of the inventive concept provide a stand for a heater pedestal with a base member and a support member detachably coupled to the base member, the support member having a plurality of ring members and at least one spacer member extending vertically from the base member, a ring member separated from another ring member by a spacer member, a ring member having an aperture which extends through the ring member in a horizontal direction, the at least one spacer member forming at least one opening between two corresponding ring members, and the ring member furthest from the base member being capable of configured to supporting a heater pedestal, and the apertures of the ring members of the support member configured to receiving receive a susceptor of the heater pedestal through the aperture of the ring members. The ring member include at least a bottom-flanged ring member and a top cap member, the bottom-flanged ring member forming a first end of the support member proximate the base member, the top cap forming a second end of the support member opposite the base member. The base member may include a center aperture with a first diameter and a second diameter, the second greater than the first, with the first diameter proximate the support member and the second diameter opposite the support the support member. The bottom-flanged ring member may include a third diameter and a fourth diameter, the third diameter of the bottom flanged ring member substantially equal to the first diameter of the center aperture, the fourth diameter of the bottom-flanged ring member substantially equal to the second diameter of the center aperture. The support member may be detachably coupled to the base member by the bottom-flanged ring of the support member which is inserted into the center aperture of the base member, the third diameter proximate the first diameter and the second diameter proximate the fourth diameter. The diameter of at least one ring member may be substantially equal to the first diameter of the center aperture. The top cap member may have a fifth diameter less than a first portion of the heater pedestal, and a sixth diameter greater than a second portion of the heater pedestal, the fifth diameter greater than the sixth diameter. The base member may have at least one arm protruding from the center aperture, the at least one arm having at least one slot configured to receive a set of wafer lift pins from the heater pedestal. One or more threaded members may extend between the top cap member and the bottom-flanged ring member. The spacer members may be cylindrically shaped with a horizontal radius and vertical axis, with a threaded member extending through the vertical axis. The top cap member may have a first recess on a top surface, the bottom-flanged ring member may have a second recess on the bottom surface, and the threaded member extends between the top cap member and the bottom-flanged ring member and secured by a first nut in the first recess and a second nut in the second recess. The ring members and the spacer members may be made of polytetrafluoroethylene. An opening between two ring members may provide laminar air flow as well as access to the susceptor of the heater pedestal. Further, the stand may be detachably coupled to a wheeled structure via connectors at an end arms of the base member.

Example embodiments of the inventive concept provide a stand for a heater pedestal, the heater pedestal including an x-shaped base member with a center circular aperture and at least one arm extending in a first direction from the center circular aperture, and the heater pedestal including a support member which includes a plurality of ring members and one or more spacer members, at least one ring member with an aperture extending through the at least one ring member in a second direction substantially perpendicular to the first direction, the support member configured to support the heater pedestal by receiving a susceptor of the heater pedestal through the aperture of the ring members, the ring members interleaved with the spacer members, and the support member protruding in the second direction from the center circular aperture of the x-shaped base member. The ring members and the spacer members form a plurality of openings providing access to the susceptor of the heater pedestal, with one or more threaded rods extending in the second direction coupling the spacer members and the ring members. The support member includes a first diameter greater than a second diameter of the heater pedestal, and the support member includes a third diameter less than a fourth diameter of the heater pedestal. The spacer members are cylindrically shaped with a horizontal radius and vertical axis, the threaded rods extending through a vertical axis of at least one of the spacer members and extend through at least one of the ring members. The ring members may include at least a bottom-flanged ring member and a top cap member, the top cap member having an outer diameter less than a first portion of the heater pedestal and an inner diameter greater than a second portion of the heater pedestal. The center circular aperture of the x-shaped base member includes a first diameter and a second diameter, the second greater than the first, and the first diameter between the second diameter and the support member. The bottom-flanged ring member includes a third diameter and a fourth diameter, the third diameter substantially equal to the first diameter of the center circular aperture and the fourth diameter substantially equal to the second diameter of the center circular aperture. The support member is detachably coupled to the x-shaped base member, with the first diameter proximate the third diameter and the second diameter proximate the fourth diameter.

Example embodiments of the inventive concept provide a stand for a heater pedestal, the heater pedestal including a base member and a support member. The support member includes a plurality of ring members and one or more spacer members arranged in a first direction from the base member. The ring members each include an aperture extending therethrough in a second direction substantially perpendicular to the first direction, and a bore extending through the ring members in a direction substantially parallel to the aperture. The ring members are interleaved by the spacer members.

The support member includes a rod extending in the second direction through the bore of the ring members and through one or more spacer members. The ring members include at least a bottom-flanged ring member and a top cap member. The bottom-flanged ring member forming a first end of the support member proximate the base member, the top cap member forming a second end of the support member opposite the base member in the second direction. The top cap member is configured to support a heater pedestal by receiving the susceptor of the heater pedestal through the aperture of the top cap member. The base member has a center aperture with a first diameter and a second diameter, the second greater than the first, the first diameter being proximate the support member. The second diameter opposite the support member. The bottom-flanged ring member may include a third diameter and a fourth diameter, the third diameter of the bottom-flanged ring member substantially equal to the first diameter of the center aperture, the fourth diameter of the bottom-flanged ring member substantially equal to the second diameter of the center aperture. The support member is detachably coupled to the base member by the bottom-flanged ring of the support member inserted into the center aperture of the base member, with the third diameter proximate the first diameter and the second diameter proximate the fourth diameter. The top cap member has a fifth diameter less than a first portion of the heater pedestal, a sixth diameter greater than a second portion of the heater pedestal, and the fifth diameter is greater than the sixth diameter.

BRIEF DESCRIPTION OF THE DRAWINGS

The written disclosure herein describes illustrative embodiments which are non-limiting and non-exhaustive. Reference is made to certain of such illustrative embodiments which are depicted in the figures, as listed below.

DETAILED DESCRIPTION

Various example embodiments will be described more fully hereinafter with reference to the accompanying drawings. The present inventive concept may, however, be embodied in many alternate forms and should not be construed as limited to the example embodiments set forth herein. Rather, these example embodiments are provided so that this description will be thorough and complete, and will fully convey the scope of the present inventive concept to those skilled in the art.

Contamination of semiconductor processing equipment is a constant issue within semiconductor manufacturing. Equipment that comes into contact with substrates is especially problematic as the contact generally happens on the backside of a substrate. Backside contamination may easily spread from one tool to another, causing an entire line of equipment to be taken offline to remove the contamination, resulting in serious losses of product and production throughput.

Figure 1:
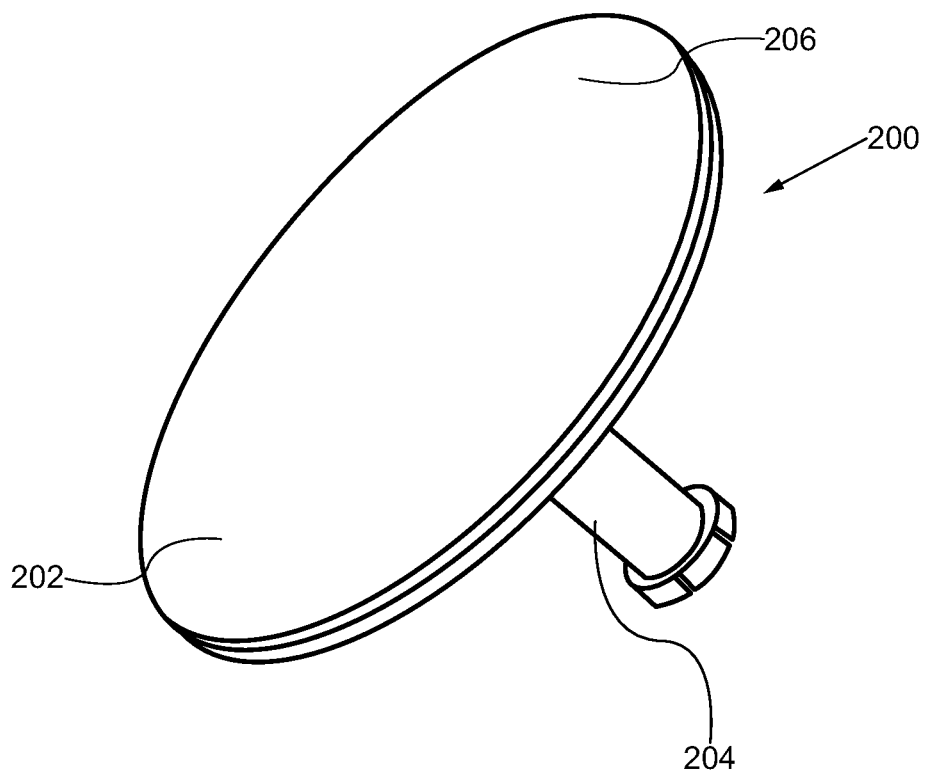
FIG. 1 is a perspective view of a heater pedestal according to an exemplary embodiment of the present inventive concept.

For example, FIG. 1 shows a semiconductor heating pedestal, known as a heater pedestal 200, for use in a variety of semiconductor processes to heat substrates before and after processing steps. For example, the Producer by Applied Materials uses the heater pedestal 200 to apply heat to a substrate before and after chemical-vapor-deposition (CVD) processes. The heater pedestal 200 is removed during routine preventive maintenance as part of cleaning and servicing the semiconductor equipment. However, the heater pedestal 200 has an irregular shape, with a first portion 202 having a disc shape and a second portion 204, also known as a susceptor, having a cylindrical shape.

The first portion 202 acts as the heater surface and contact surface for a substrate. One or more wafer lift pins 206 are within a first surface of the first portion 202, with the pins being able to raise and lower as part of a routine wafer handling process. The first portion 202 has within the first surface both a heating element for heating a substrate, such as one or more inductive heaters, as well as a mechanism for monitoring the temperature of the first portion 202, such as one or more thermocouples.

The second portion 204 is a cylindrically shaped section contacting the first portion 202 on a side opposite the one or more wafer lift pins 206. The second portion 204 may share the same central axis with the first portion 202. The second portion 204 may also be a susceptor for the heater pedestal 200, converting electrical power into heat that flows into the rest of the heater pedestal 200. Additionally, the second portion 204 may act as a support for the first portion 202, providing both mechanical support as well as support for leads and cables within the second portion 204 which connect to power and sensor connections when the heater pedestal 200 is placed in a semiconductor processing chamber.

When a heater pedestal 200 is removed from a semiconductor processing chamber, the shape of the heater pedestal 200 presents a number of challenges. The second portion 204 may be precision tooled with a number of leads extending out from the bottom of the heater pedestal 200. Placing the heater pedestal 200 on its side places mechanical stress on the second portion 204 and may damage the heater pedestal 200. These heater pedestals 200 are precision tooled and not only have a high cost to replace, but a long lead time during which any equipment requiring a heater pedestal 200 is useless, reducing throughput of an entire manufacturing line. Furthermore, placing the first portion 202 with the wafer contact surface facing down is contraindicated, as the first portion 202 becomes easily contaminated and will require extensive and time-consuming effort to clean.

Figure 2:
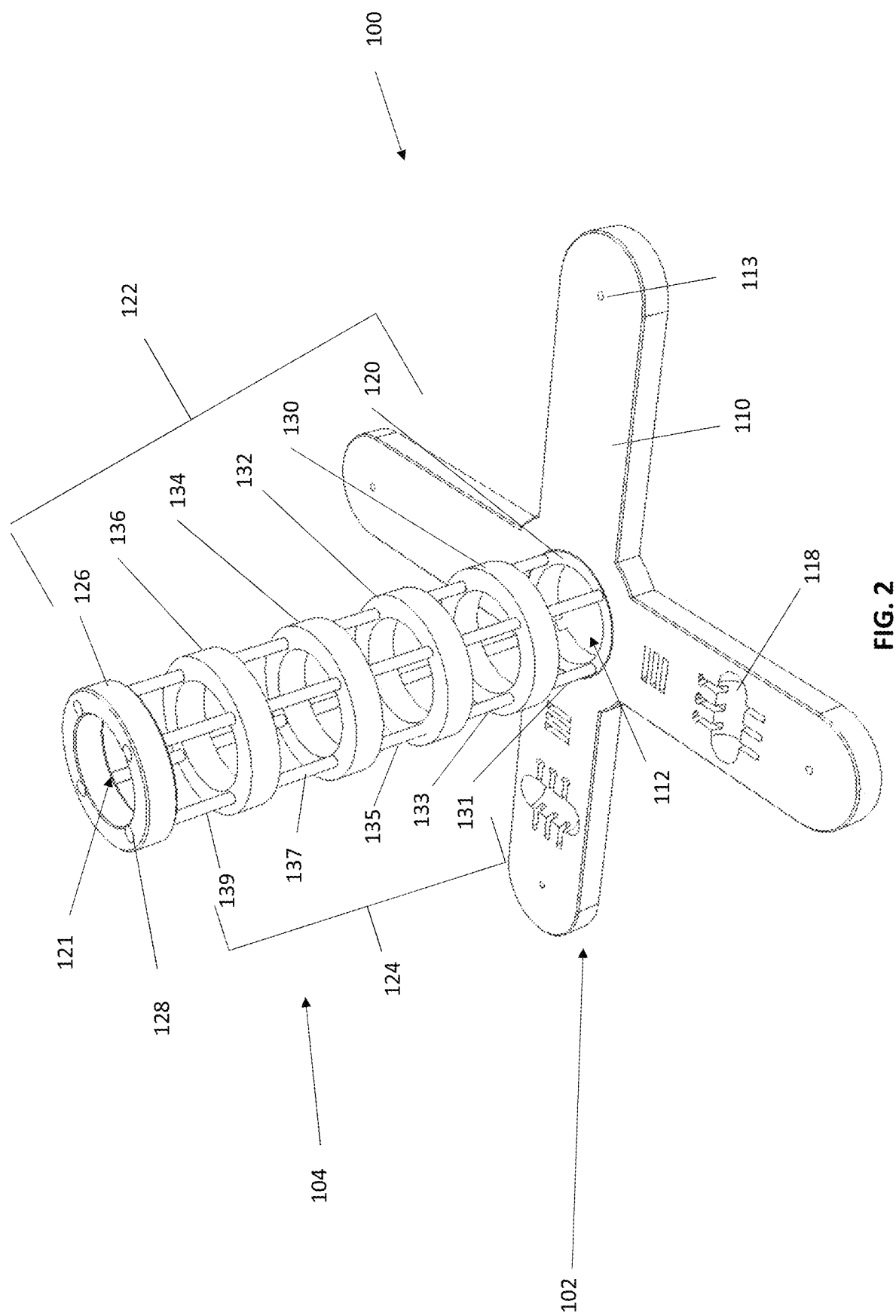
FIG. 2 is a perspective view of a stand according to an exemplary embodiment of the present inventive concept.

FIG. 2 shows an example of a stand 100 for a heater pedestal 200. The stand 100 includes a base member 102 and a support member 104 detachably coupled to the base member 102. The support member 104 extends primarily vertically from the base member 102, orthogonal from the base member 102 which extends primarily in the horizontal direction. The support member 104 may be cylindrically shaped. The support member 104 includes a plurality of ring members 122 and one or more spacer members 124. Each of the plurality of ring members 122 are separated from one another by one or more spacer members 124. Each of the plurality of ring members 122 has a center aperture 121 which extends through the ring member and has a horizontal radius. Each center aperture 121 may share a common vertical axis with the center of the base member 102. As shown in FIG. 2, the center aperture 121 is a circular center aperture, although in other embodiments, the center aperture 121 may be oval-shaped. The ring member of the plurality of ring members 122 furthest from the base member 102 is configured to support the heater pedestal 200, with the center aperture 121 receiving the second portion 204 of the heater pedestal 200.

The plurality of ring members 122 include a bottom-flanged ring member 120 and a top cap member 126. The bottom-flanged ring member 120 forms a first end of the support member 104 proximate the base member 102, while the top cap member 126 forms a second end of the support member 104 opposite the base member 102, also referred to as the distal end.

Each of the one or more spacer members 124 forms at least one opening between two adjacent ring members of the plurality of ring members 122. For example, FIG. 2 shows a first spacer member 131 between the bottom-flanged ring member 120 and a first intermediate ring 130; a second spacer member 133 between the first intermediate ring 130 and a second intermediate ring 132; a third spacer member 135 between the second intermediate ring 132 and a third intermediate ring 134; a fourth spacer member 137 between the third intermediate ring 134 and the fourth intermediate ring 136; and a fifth spacer member 139 between the fourth intermediate ring 136 and the top cap member 126. Additionally, the one or more spacer members 124 and the plurality of ring members 122 are shown as interleaved in FIG. 2, although in other embodiments multiple rings or spacers may be placed together. Furthermore, each of the one or more spacer members 124 may include a plurality of spacer members in between each ring, for example four spacers as shown in FIG. 2. In other embodiments the number of spacers members 124 between each ring may vary.

Figure 4:
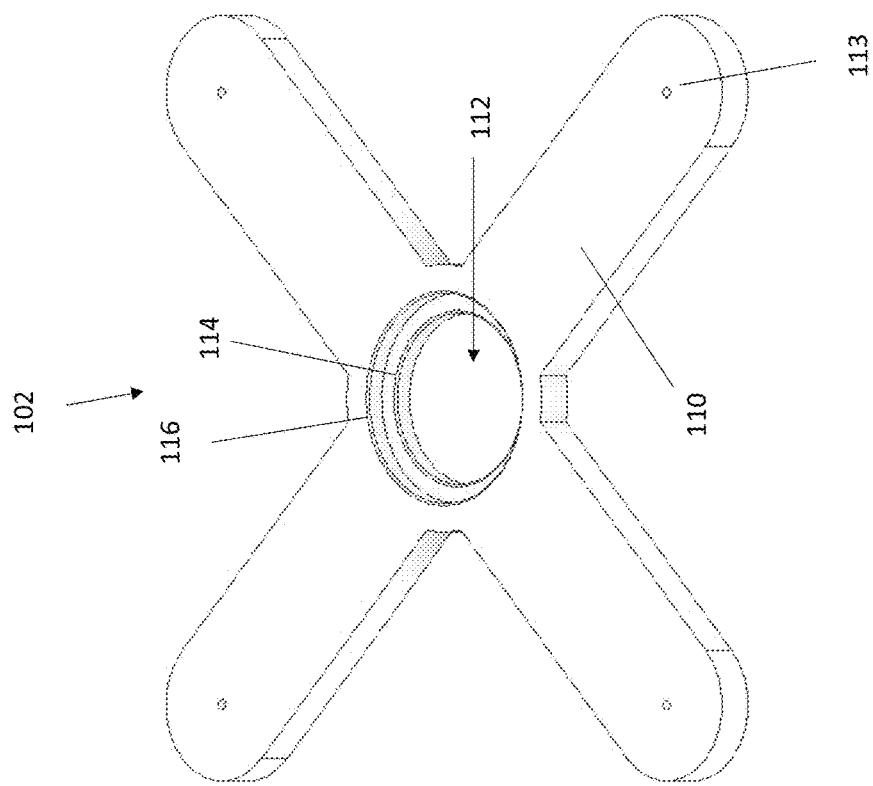
FIGS. 3 and 4 are a top and bottom perspective view of a base member according to an exemplary embodiment of the present inventive concept.
Figure 3:
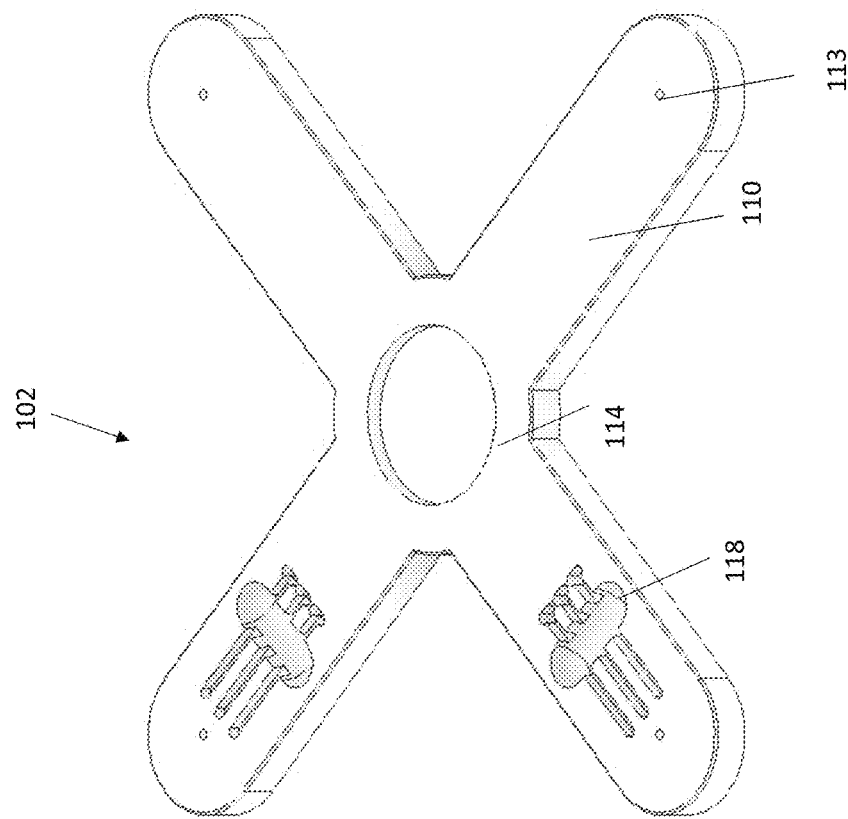
Figure 6:
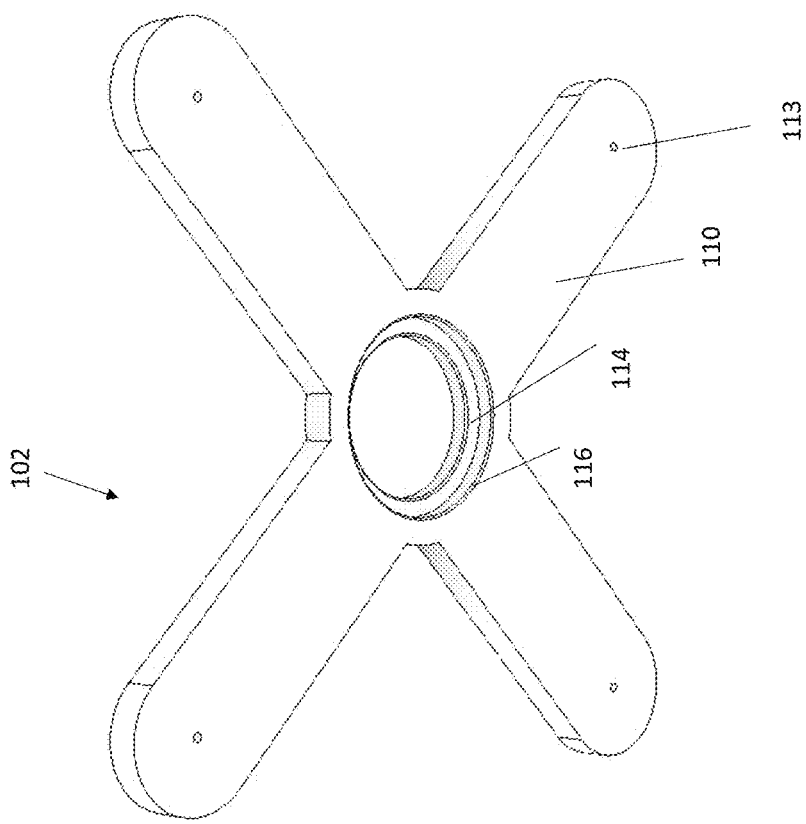
FIGS. 5 and 6 are a top and a bottom perspective view of another base member according to an exemplary embodiment of the present inventive concept.
Figure 5:
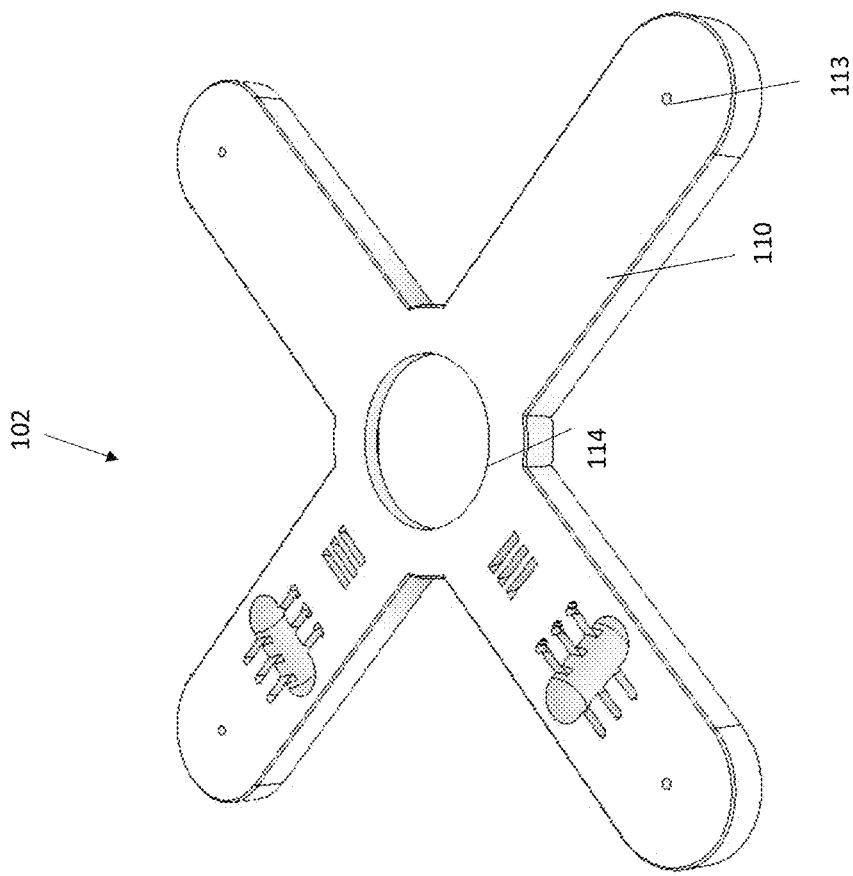

The base member 102 includes a center aperture 112. In FIG. 2, the center aperture 112 can be seen with the bottom-flanged ring member 120 within the aperture. The center aperture 112 is further shown as a circular center aperture in FIGS. 3-6, with FIG. 3 and FIG. 4 showing top and bottom views of a first version of the base member 102 and with FIG. 5 and FIG. 6 showing top and bottom views of a second version of the base member 102. As shown in FIGS. 3-6, the base member 102 includes the center aperture 112, with a first diameter 114. A second diameter 116 is shown from below in FIG. 4 and FIG. 6. The center aperture 112 has the second diameter 116 forming a rim recessed from the first diameter 114, such that the second diameter 116 is greater in size than the first diameter 114. The first diameter 114 is also more proximate the support member 104, with the second diameter 116 on the opposite face of the base member 102. The base member 102 may also include at least one arm 110 extending from the center aperture 112. In the example of FIG. 2-6, the base member 102 includes four individual arms 110, forming an X-shaped base member. On the at least one arm 110 is one or more slots 118. The one or more slots 118 may be configured to receive one or more wafer lift pins 206. FIG. 2 and FIG. 4 show two versions of the one or more slots 118. In FIG. 3, the slots are designed for an entire pin of the one or more wafer lift pins 206. In FIG. 5, the slots are designed for disassembled parts of the one or more wafer lift pins 206.

Figure 8:
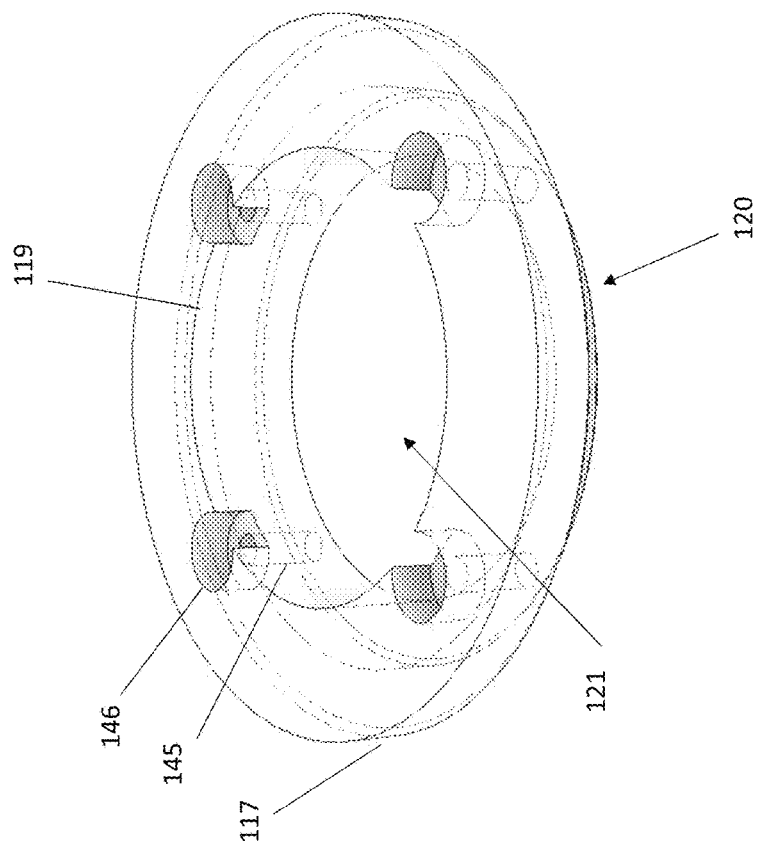
FIGS. 7 and 8 are a top and a bottom perspective view of a bottom-flanged ring member according to an exemplary embodiment of the present inventive concept.
Figure 7:
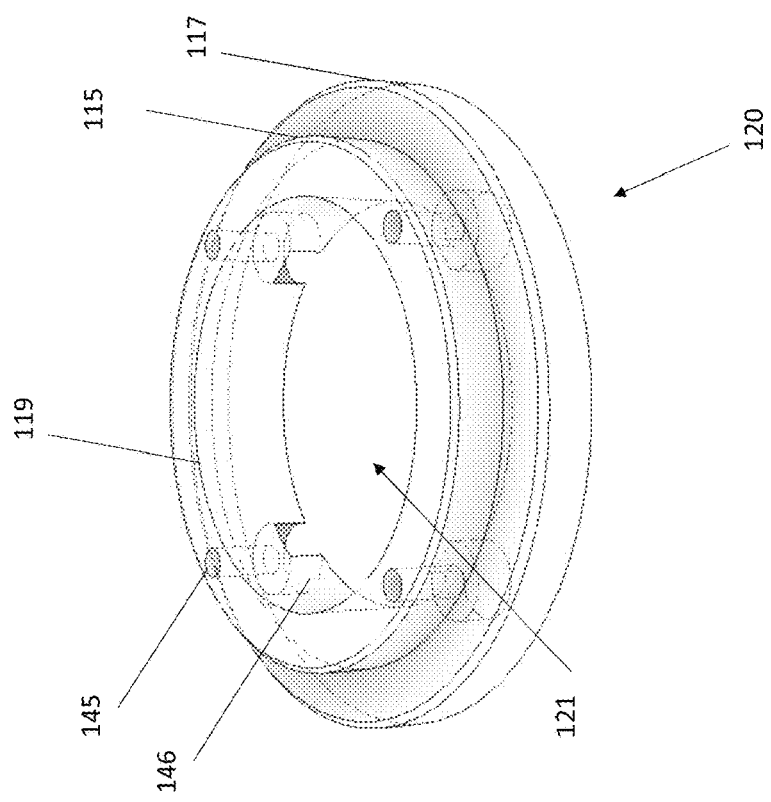

FIG. 7 and FIG. 8 show a top view and bottom view of the bottom-flanged ring member 120. The bottom-flanged ring member 120 has two outer diameters, a third diameter 115 and a fourth diameter 117. The third diameter 115 is substantially equal to the first diameter 114 of the base member 102, and the fourth diameter 117 is substantially equal to the second diameter 116 of the base member 102. As shown in FIG. 2, the support member 104 may be detachably coupled to the base member 102 by inserting the bottom-flanged ring member 120 into the center aperture 112 of the base member 102. The third diameter 115 is thus proximate the first diameter 114 and the fourth diameter 117 is thus proximate the second diameter 116. Thus, when the support member 104 is assembled with the base member 102, the fourth diameter 117 may be under the base member 104 proximate the second diameter 116, with the first diameter 114 holding the support member 104 in place.

Figure 10:
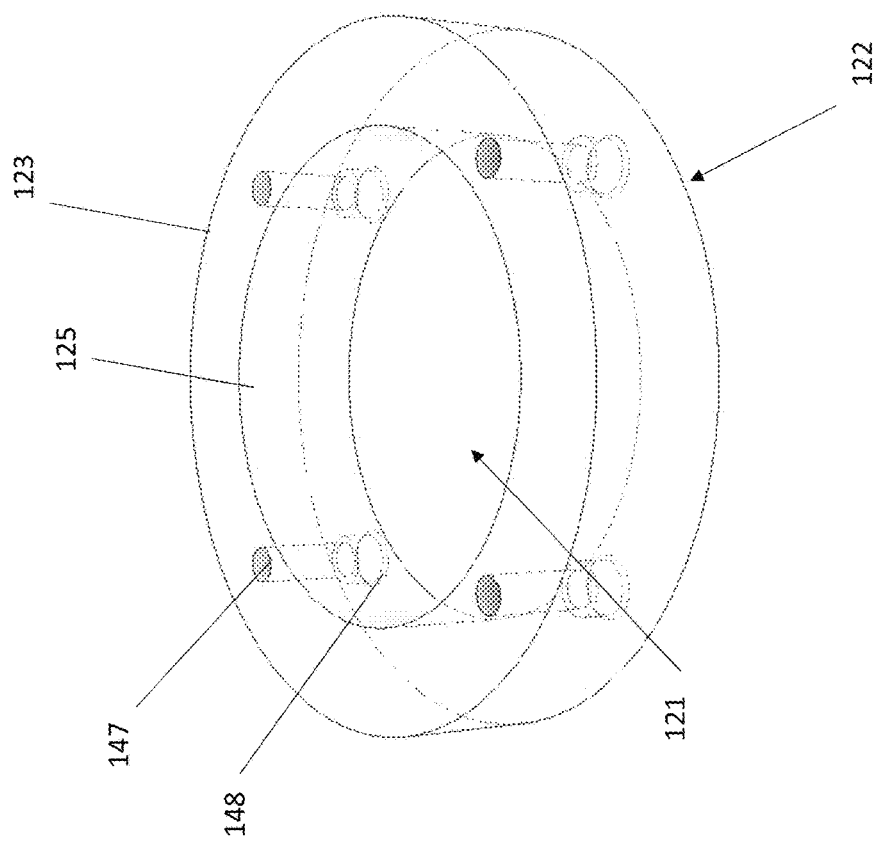
FIGS. 9 and 10 are a top and a bottom perspective view of a ring member according to an exemplary embodiment of the present inventive concept.
Figure 9:
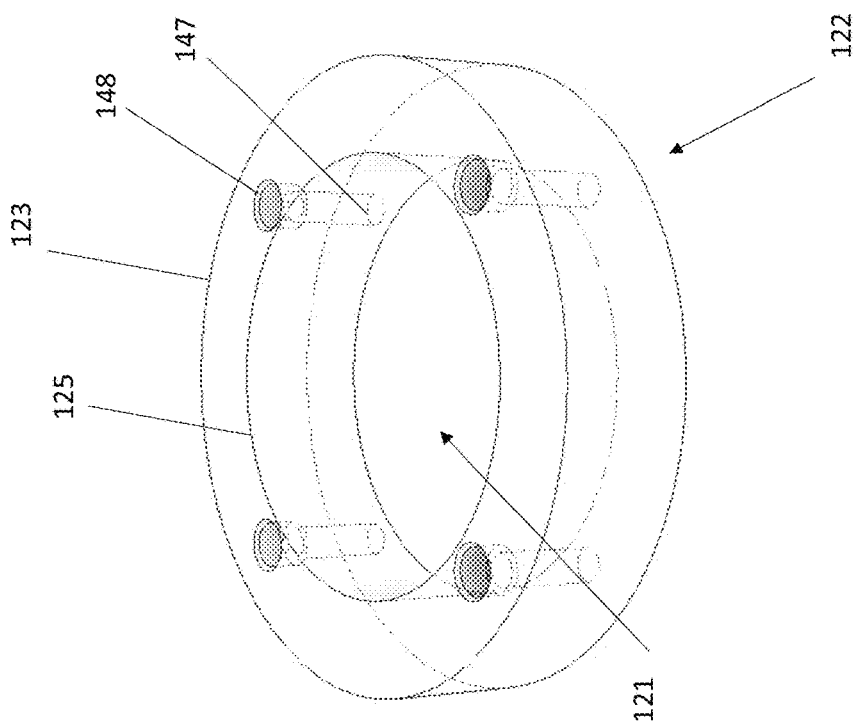

FIG. 9 and FIG. 10 show a top view and a bottom view of an intermediate ring of the plurality of ring members 122, for example a first intermediate ring 130, a second intermediate ring 132, a third intermediate ring 134, a fourth intermediate ring 136 as shown in FIG. 2. An outer diameter 123 of a ring of the plurality of ring members 122 may be substantially equal to the first diameter 114, while an inner diameter 125 of a ring of the plurality of ring members 122 is less than the first diameter 114.

Figure 12:
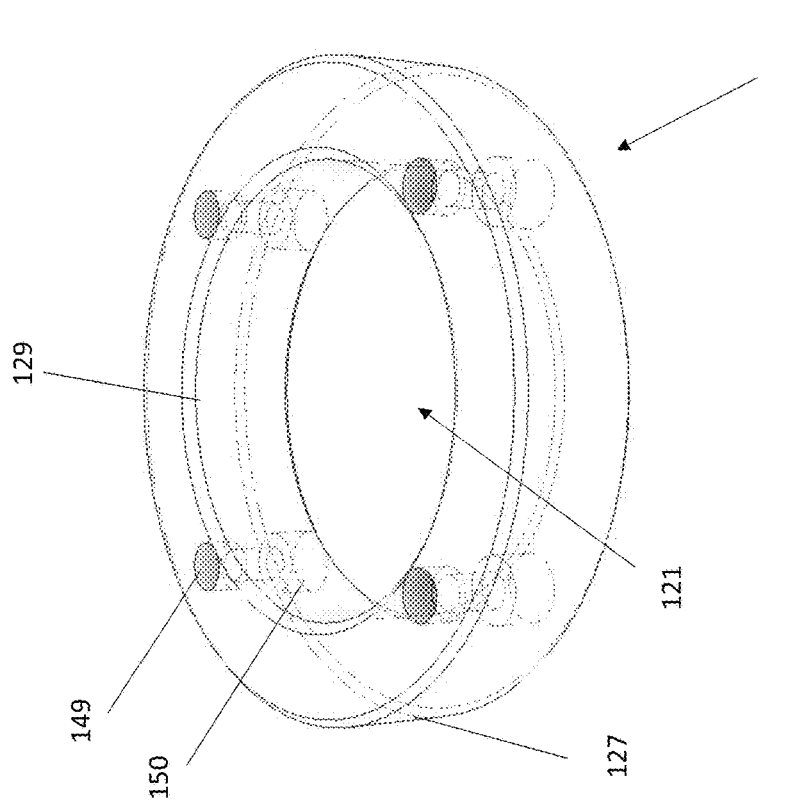
FIGS. 11 and 12 are a top and a bottom perspective view of a top cap member according to an exemplary embodiment of the present inventive concept.
Figure 11:
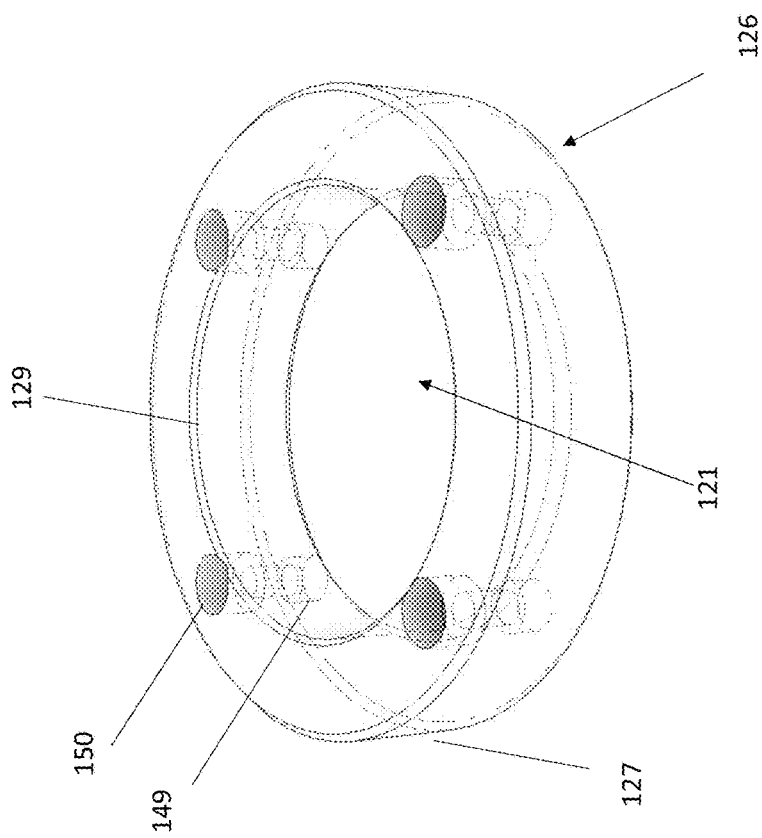

FIG. 11 and FIG. 12 show a top view and a bottom view of the top cap member 126. The top cap member 126 has a fifth diameter 127 and a sixth diameter 129, and the fifth diameter 127 is greater than the sixth diameter 129, since the fifth diameter 127 is the outer diameter of top cap member 126 and the sixth diameter 129 is the inner diameter of the top cap member 126. However, the sixth diameter 129 is larger than the diameter of the second portion 204 of the heater pedestal 200, while the fifth diameter 127 is less than the diameter of the first portion 202 of the heater pedestal 200. Thus, the second portion 204 may be slid into the top cap member 126, while the first portion 202 rests on the top cap member 126. Furthermore, the inner diameter 125 of one or more of the plurality of ring members 122 may be substantially equal to the sixth diameter 129. In some embodiments, the inner diameter 125 may be greater than the sixth diameter 129. Thus, the second portion 204 may be slid further down the support member 104 past additional rings of the plurality of ring members 122. The height of the support member 104 thus is greater than the distance the second portion 204 protrudes from the first portion 202.

Figure 14:
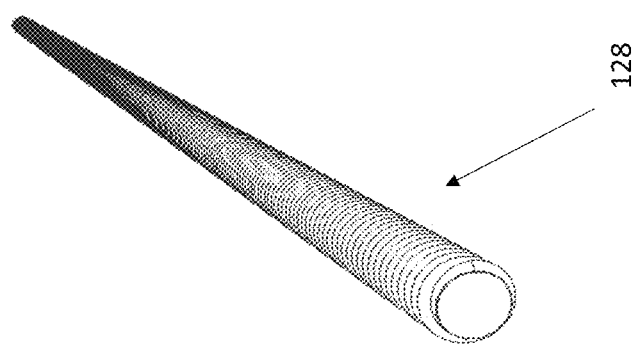
FIG. 14 is a perspective view of a rod according to an exemplary embodiment of the present inventive concept.
Figure 13:
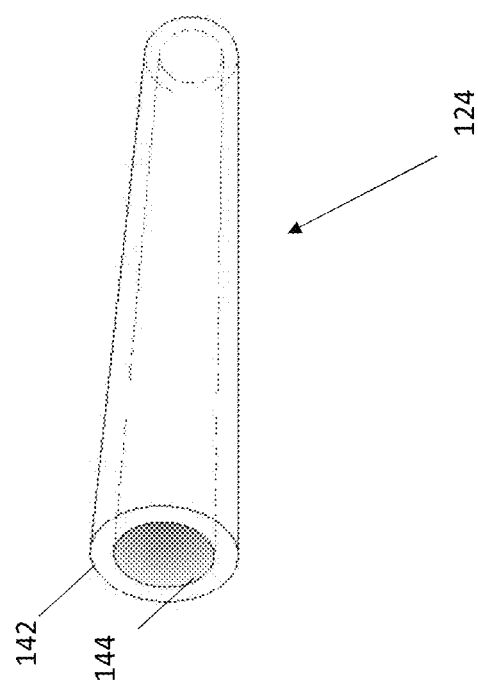
FIG. 13 is a perspective view of a spacer member according to an exemplary embodiment of the present inventive concept.
Figure 15:
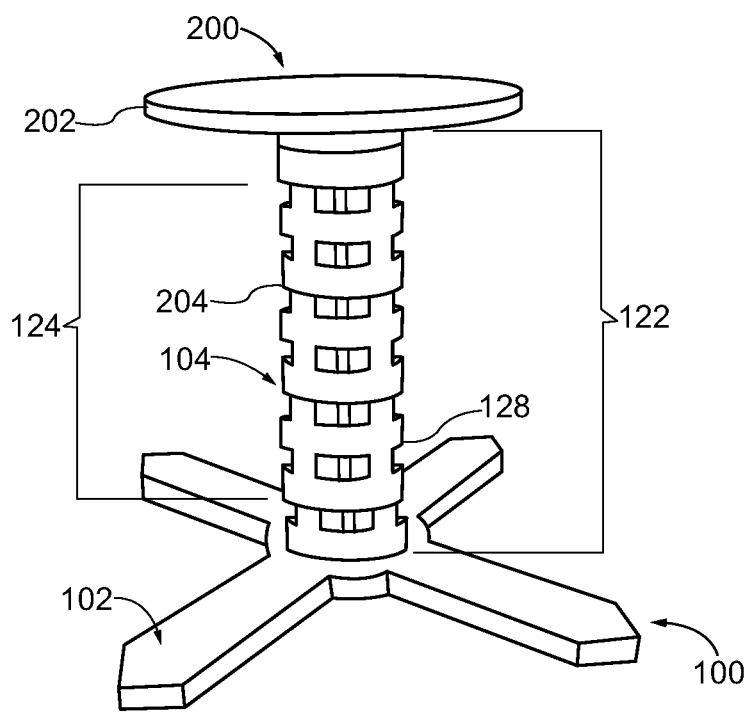
FIG. 15 is a perspective view of a heater pedestal on a stand according to an exemplary embodiment of the present inventive concept.
Figure 16:
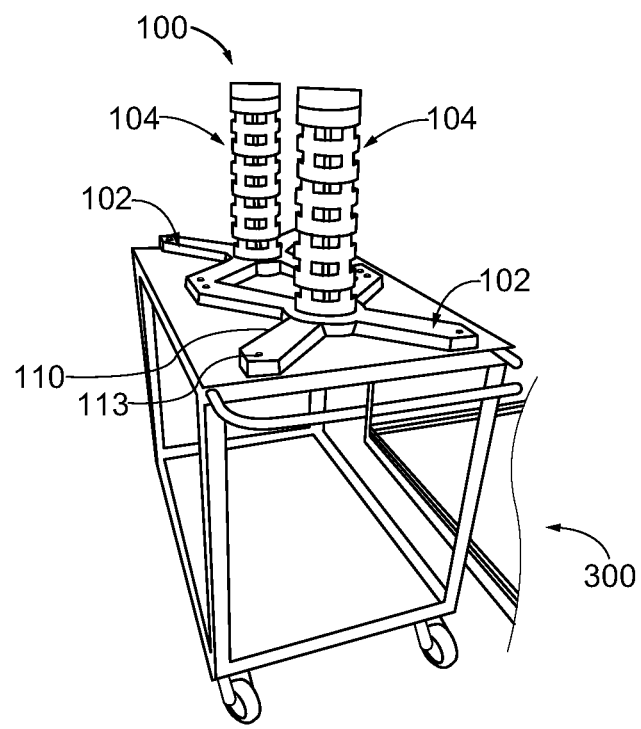
FIG. 16 is a perspective view of a heater pedestal on a stand on a wheeled structure according to an exemplary embodiment of the present inventive concept.

One or more spacer members 124 are shown in FIG. 2 and in FIG. 13 as a cylindrically shaped tube with a horizontal radius and a vertical axis, with a spacer member 124 having an outer circumference 142 and an inner channel 144. In other embodiments, the one or more spacer members 124 may be solid shape, such as a crescent or arc-shape. One or more rods 128 may extend within the support member 104 between the top cap member 126 and the bottom-flanged ring member 120. The one or more rods 128 may also extend through one or more spacer members 124 as shown in FIG. 2 via the inner channel 144. The one or more rods 128 may be threaded to form a threaded member as shown in FIG. 14. In the examples shown in FIGS. 2-12, the one or more rods 128 may be four threaded rods, spaced equally around the circumference of the support member 104, and extending through the spacer members 124. In other embodiments, the one or more rods 128 may not extend through the spacer member and are spaced apart from the one or more spacer members 124. For example FIG. 15 and FIG. 16 show a support member 104 with a plurality of arc-shaped spacer members 124 spaced apart from the rods 128.

The one or more rods 128 may extend between the top cap member 126 and the bottom-flanged ring member 120 by extending between each of the plurality of ring members 122 and one or more spacer members 124. The one or more rods 128 may act as a guide during the assembly process, with fasteners at either end. Furthermore, the fasteners may be nuts or bolts securing to the one or more rods 128.

FIG. 7 and FIG. 8 show the bottom-flanged ring member 120 may include recesses for the one or more rods 128 and for the fasteners, for example, a first bore 145 and a first recess 146. The first bore 145 is sized to fit one of the one or more rods 128 and extends from a top surface to a bottom surface of the bottom-flanged ring member 120, while the first recess 146 is sized to fit a fastener for a rod 128 and is only on the bottom surface, distal from the support member 104, of the bottom-flanged ring member 120. The first recess 146 allows a fastener to be reached when needed to adjust the stand 100, while allowing the one or more rods 128 to avoid contact with a surface the stand is placed on. In the examples shown in FIGS. 1-11, the first bore 145 and the first recess 146 may be four individual bores and four individual recesses spaced equally around the circumference of the support member 104.

FIGS. 9 and 10 show top and bottom views of one of the plurality of ring members 122. The plurality of ring members 122 may include recesses for the one or more rods 128 with a second bore 147 and a second recess 148. The second bore 147, like the first bore 145, is sized to fit one rod of the one or more rods 128. The second bore 147 extends through an entire ring. However, the second recess 148 differs from the first recess 146 and third recess 150. While the second recess 148 is on the side distal to the base member 102 and cut into the surface of a ring of the plurality of ring members 122, second recess 148 is sized to fit one of the one or more spacer members 124. During assembly, a one or more spacer members 124 may fit within the second recess 148 to allow easy alignment and to provide additional lateral stability for the stand 100. Furthermore, as in the examples shown in FIGS. 2-12, the second bore 147 and the second recess 148 may be four individual bores and four individual recesses spaced equally around the circumference of the support member 104.

FIG. 11 and FIG. 12 show top and bottom views of the top cap member 126 which may include recesses for the one or more rods 128 and for the fasteners, for example, top cap member 126 may have a third bore 149 and a third recess 150. The third bore 149 extends through the top cap member 126 from the side proximate the base member 102 to the opposing distal side of the top cap member 126. The third bore 149 is also sized to fit a rod 128. The third recess 150 is only on the distal side of the top cap member 126, and extends down sufficient to allow a fastener, such as a nut or bolt, to avoid contact with a heater pedestal 200 placed on the stand 100. In the examples shown in FIGS. 2-12, the third bore 149 and the third recess 150 may be four individual bores and four individual recesses spaced equally around the circumference of the support member 104.

The base member 102, as well as the plurality of ring members 122, and the one or more spacer members 124, may be made of a non-stick polymer with inert surface properties, for example Teflon®, aka polytetrafluoroethylene, as well as co-polymers thereof. Furthermore, the one or more rods 128 may be made of any suitable metal, for example, aluminum.

The support member 104 using a ring and spacer version as shown in FIG. 2 has a number of additional features. The plurality of ring members 122 and the one or more spacer members 124 provide a set of openings between each of the plurality of ring members 122. These openings are capable of providing a laminar air flow when within a clean room environment, preventing particle contamination. Furthermore, as shown in FIG. 15, the opening between each of the plurality of ring members 122 from the one or more spacer members 124 provide access to the second portion 204 of a heater pedestal 200 when the heater pedestal 200 is set on stand 100. Users may then inspect the parts of the heater pedestal for damage as well as test individual components, for example, testing the power leads and sensor leads. Additionally, the user may also repair any damaged parts.

The support member 104 may use modular parts to allow adjustment of size of the stand 100. For example, although the stand 100 may be designed for the heater pedestal 200, different semiconductor processing equipment may benefit from the same designs. The use of modular parts allows a stand 100 to be adjusted as needed. For example, the plurality of ring members 122 and the one or more spacer members 124 may be adjusted as to control the size of the openings. In this example, the length of the one or more spacer members 124 may be used to provide larger or smaller openings between each ring of the plurality of ring members 122, also adjusting the total number of rings of the plurality of ring members 122. Further, the number of the one or more spacer members 124 and the number of the one or more rods 128 may also be adjusted. For example, although FIG. 2 shows four spacer members 124 and four rods 128, any number of spacer members 124 and/or rods 128 may be used, include both fewer such as two or three, or more, such as five or six. In additional, although FIG. 2 shows the plurality of ring members 122 interleaved with the one or more spacer members 124, in other embodiments, multiple spacer members of the one or more spacer members 124 may be stacked vertically between each ring.

FIG. 16 shows an example with the stand 100 may be detachably coupled to a wheeled structure 300. A connector 113 at the end of at least one arm 110 of the base member 102, such as a bolt passing through the arm 110, may be used for the detachable coupling. The wheeled structure 300 may be, as in the example of FIG. 16, a cart of the type suitable for use in clean rooms. In other embodiments, the connector 113 may instead couple the stand 100 to a table or desk. Coupling the stand 100 to a wheeled structure 300 also allows for the heater pedestals 200 to be moved easily between maintenance locations, such as when a replacement heater pedestal is installed from storage. Alternatively, a stand 100 coupled to a wheeled structure 300 allows the stand 100 to be moved where required. For example, a wheeled structure 300 may be moved between bays within a semiconductor fabrication plant, allowing a handful of the stands 100 to be used within a single plant.

Figure 17:
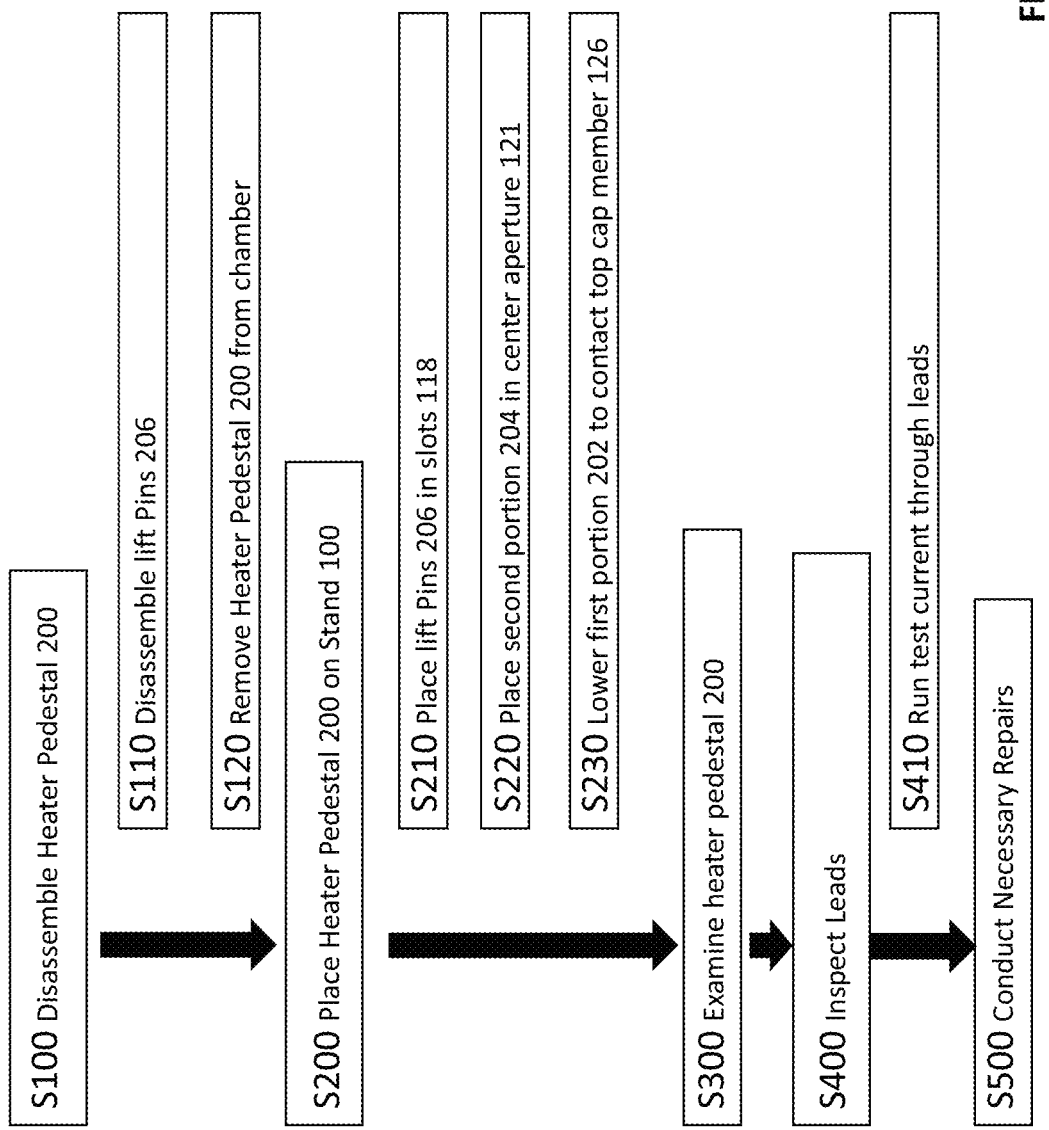
FIG. 17 is a flow chart of a method of use of a stand according to an exemplary embodiment of the present inventive concept.

FIG. 17 demonstrate an example of a method for using the stand 100. At S100, a heater pedestal 200 is disassembled. At S200, the heater pedestal 200 is placed on the stand 100. At S300, the heater pedestal 200 may be examined by the user, for example by using visual inspection, although tool assisted examination such as video inspection may be used. At S400, the user may further inspect the leads for the heater pedestal 200. Afterwards in S500, any necessary repairs are performed, and the heater pedestal 200 may wait until the rest of the chamber is ready for reinstall.

Additionally, a number of subsidiary steps may be taken. For example, during S100, the disassembly of the heater pedestal 200, at S110 the one or more wafer lift pins 206 may be removed from the first portion 202. Following S110, at S120 the heater pedestal 200 is removed from the semiconductor processing chamber with the first portion 202 and the second portion 204 still assembled as a unit. At S210 the one or more wafer lift pins 206 may be placed into the one or more slots 118 within the stand 100. At S220, the second portion 204 of the heater pedestal 200 is lined up with and slid into center aperture 121 of the top cap member 126. At S230 the first portion 202 of the heater pedestal 200 is then lowered until it rests on the top cap member 126. Then, at S410, the lead inspection may include running current in one or more power leads and one or more sensor leads, for example, by hooking them up to a test bench or multimeter to provide a measurable electrical signal. Once inspection and any repairs are completed, the heater pedestal 200 may be left on stand 100 until maintenance is complete.

While example embodiments of the present inventive concept have been particularly shown and described, it will be understood by one of ordinary skill in the art that variations in form and detail may be made therein without departing from the scope of the attached claims.

The invention claimed is:

1. A stand for a heater pedestal, comprising:
a base member; and
a support member detachably coupled to the base member,
the support member comprising a plurality of ring members and at least one spacer member being arranged in a first direction from the base member,
at least one of the ring members being separated from another of the ring members by the at least one spacer member,
the ring members each comprising an aperture extending therethrough in the first direction,
the at least one spacer member forming at least one opening between two adjacent ring members, the at least one opening extending in a second direction substantially perpendicular to the first direction, and
the ring members are configured to support a heater pedestal by receiving a susceptor of the heater pedestal through the aperture of the ring members.

2. The stand of claim 1,
wherein the ring members comprise at least a bottom-flanged ring member and a top cap member, the bottom-flanged ring member forming a first end of the support member proximate the base member and the top cap member forming a second end of the support member opposite the base member,
wherein the base member comprises a center aperture with a first diameter and a second diameter, the second diameter greater than the first diameter, the first diameter proximate the support member, the second diameter opposite the support member,
wherein the bottom-flanged ring member comprises a third diameter and a fourth diameter, the third diameter of the bottom-flanged ring member is substantially equal to the first diameter of the center aperture, the fourth diameter of the bottom-flanged ring member is substantially equal to the second diameter of the center aperture, and
wherein the support member is detachably coupled to the base member by the bottom-flanged ring of the support member inserted into the center aperture of the base member, with the third diameter proximate the first diameter and the second diameter proximate the fourth diameter.

3. The stand of claim 2, wherein a diameter of at least one ring member is substantially equal to the first diameter of the center aperture.

4. The stand of claim 2, wherein the top cap member comprises a fifth diameter less than a first portion of the heater pedestal, a sixth diameter greater than a second portion of the heater pedestal, and the fifth diameter greater than the sixth diameter.

5. The stand of claim 2, wherein the base member comprises at least one arm protruding from the center aperture of the base member, the at least one arm comprising at least one slot configured to receive a set of wafer lift pins from the heater pedestal.

6. The stand of claim 2, further comprising at least one threaded member extending between the top cap member and the bottom-flanged ring member.

7. The stand of claim 6, wherein at least one spacer member is cylindrically shaped with a horizontal radius and a vertical axis, and at least one threaded member extends through the vertical axis.

8. The stand of claim 6, wherein the top cap member comprises a first recess on a top surface,
wherein the bottom-flanged ring member comprises a second recess on a bottom surface, and
wherein the threaded member is secured by a first nut in the first recess of the top cap member and by a second nut in the second recess of the bottom-flanged ring member.

9. The stand of claim 1, wherein at least one ring member and the at least one spacer member comprise polytetrafluoroethylene.

10. The stand of claim 1, wherein the at least one opening between two corresponding ring members provides a laminar air flow and provides access to the susceptor of the heater pedestal.

11. The stand of claim 1, wherein the stand is detachably coupled to a wheeled structure via a connector at an end of at least one arm of the base member.

12. A stand for a heater pedestal, comprising:
an x-shaped base member with a center circular aperture, and at least one arm extending in a first direction from the center circular aperture; and
a support member comprising a plurality of ring members and one or more spacer members, at least one ring member comprising an aperture extending through the at least one ring member in a second direction substantially perpendicular to the first direction, wherein:
the support member is configured to support the heater pedestal by receiving a susceptor of the heater pedestal through the aperture of the ring members,
the ring members are interleaved with the spacer members, the support member protrudes in the second direction from the center circular aperture of the x-shaped base member, the ring members and spacer members form a plurality of openings that provide access to the susceptor of the heater pedestal, and one or more threaded rods extend in the second direction and couple the spacer members and ring members.

13. The stand of claim 12, wherein the support member comprises a first diameter greater than a second diameter of the heater pedestal, and the support member comprises a third diameter less that a fourth diameter of the heater pedestal.

14. The stand of claim 12,
wherein the spacer members are cylindrically shaped with a horizontal radius and a vertical axis,
wherein the threaded rods extend through a vertical axis of at least one of the spacer members, and
wherein the threaded rods extend through at least one of the ring members.

15. The stand of claim 12, wherein the ring members comprise at least a bottom-flanged ring member and a top cap member, and
wherein the top cap member comprises an outer diameter less than a first portion of the heater pedestal and an inner diameter greater than a second portion of the heater pedestal.

16. The stand of claim 15,
wherein the center circular aperture of the x-shaped base member comprises a first diameter and a second diameter, the second diameter greater than the first diameter, and wherein the first diameter is between the second diameter and the support member,
wherein the bottom-flanged ring member comprises a third diameter and a fourth diameter, wherein the third diameter of the bottom-flanged ring member is substantially equal to the first diameter of the center circular aperture, wherein the fourth diameter of the bottom-flanged ring member is substantially equal to the second diameter of the center circular aperture, and
wherein the support member is detachably coupled to the x-shaped base member by the bottom-flanged ring member of the support member inserted into the center circular aperture of the x-shaped base member, with the first diameter proximate the third diameter and the second diameter proximate the fourth diameter.

17. A stand for a heater pedestal, comprising:
a base member; and
a support member comprising a plurality of ring members and one or more spacer members being arranged in a first direction from the base member,
the ring members each comprising an aperture extending therethrough in a second direction substantially perpendicular to the first direction, and a bore extending through the ring members in a direction substantially parallel to the aperture,
the ring members being interleaved by the spacer members;
wherein the support member further comprises a rod extending in the second direction through the bore of the ring members and through one or more spacer members;
wherein the ring members further comprise at least a bottom-flanged ring member and a top cap member, the bottom-flanged ring member forming a first end of the support member proximate the base member, the top cap member forming a second end of the support member opposite the base member in the second direction; and
wherein the top cap member is configured to support a heater pedestal by receiving a susceptor of the heater pedestal though the aperture of the top cap member.

18. The stand of claim 17, wherein the base member comprises a center aperture with a first diameter and a second diameter, the second diameter greater than the first diameter, the first diameter proximate the support member, the second diameter opposite the support member.

19. The stand of claim 18, wherein the bottom-flanged ring member comprises a third diameter and a fourth diameter, the third diameter of the bottom-flanged ring member is substantially equal to the first diameter of the center aperture, the fourth diameter of the bottom-flanged ring member is substantially equal to the second diameter of the center aperture.

20. The stand of claim 19, wherein the support member is detachably coupled to the base member by the bottom-flanged ring of the support member inserted into the center aperture of the base member, with the third diameter proximate the first diameter and the second diameter proximate the fourth diameter, and
wherein the top cap member comprises a fifth diameter less than a first portion of the heater pedestal, a sixth diameter greater than a second portion of the heater pedestal, and the fifth diameter being greater than the sixth diameter.

* * * * *